United States Patent
Xu et al.

(10) Patent No.: US 10,452,888 B2
(45) Date of Patent: Oct. 22, 2019

(54) FLEXIBLE TOUCH PANEL, FLEXIBLE DISPLAY PANEL AND FLEXIBLE DISPLAY APPARATUS, AND FABRICATING METHOD THEREOF

(71) Applicant: BOE TECHNOLOGY GROUP CO., LTD., Beijing (CN)

(72) Inventors: Rui Xu, Beijing (CN); Xue Dong, Beijing (CN); Jing Lv, Beijing (CN); Haisheng Wang, Beijing (CN); Yingming Liu, Beijing (CN); Xiaoliang Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/565,368

(22) PCT Filed: Nov. 24, 2016

(86) PCT No.: PCT/CN2016/107058
§ 371 (c)(1),
(2) Date: Oct. 9, 2017

(87) PCT Pub. No.: WO2018/094639
PCT Pub. Date: May 31, 2018

(65) Prior Publication Data
US 2018/0307884 A1 Oct. 25, 2018

(51) Int. Cl.
*G06F 3/041* (2006.01)
*G06F 3/044* (2006.01)
(Continued)

(52) U.S. Cl.
CPC ........... *G06K 9/0002* (2013.01); *G06F 3/044* (2013.01); *G06F 3/0416* (2013.01);
(Continued)

(58) Field of Classification Search
CPC ... A61B 5/117; A61B 5/1172; A61B 5/14542; A61B 5/02438; A61B 5/6898;
(Continued)

(56) References Cited

U.S. PATENT DOCUMENTS 8,486,535 B1 *  7/2013  Nemeth ................. B60J 1/2094
                                                   428/426
8,564,314 B2 * 10/2013  Shaikh ................. G06K 9/0002
                                                   324/658
(Continued)

FOREIGN PATENT DOCUMENTS

CN    103530609 A    1/2014
CN    105867676 A    8/2016
(Continued)

OTHER PUBLICATIONS

International Search Report & Written Opinion dated Aug. 25, 2017, regarding PCT/CN2016/107058.

*Primary Examiner* — Michael J Eurice
(74) *Attorney, Agent, or Firm* — Intellectual Valley Law, P.C.

(57) ABSTRACT

The present application discloses a flexible display panel having a flexible touch panel and a flexible display module laminated together with the flexible touch panel. The flexible touch panel includes a touch sensor having a plurality of touch electrodes configured to detect a touch, and a capacitive fingerprint sensor having an array of capacitive sensing electrodes configured to enable identification of a fingerprint of a finger.

5 Claims, 4 Drawing Sheets

(51) Int. Cl.
  *G06F 21/32*    (2013.01)
  *H04B 1/38*    (2015.01)
  *H04M 1/23*    (2006.01)
  *H05K 1/00*    (2006.01)
  *G06K 9/00*    (2006.01)
  *H01L 27/32*    (2006.01)
  *H01L 51/00*    (2006.01)
  *H01L 51/52*    (2006.01)

(52) U.S. Cl.
  CPC ........ *H01L 27/323* (2013.01); *H01L 27/3244* (2013.01); *H01L 51/0097* (2013.01); *H01L 51/5253* (2013.01); *H01L 51/5281* (2013.01); *G06F 2203/04102* (2013.01); *G06F 2203/04103* (2013.01); *G06K 9/0008* (2013.01); *H01L 2251/5338* (2013.01)

(58) Field of Classification Search
  CPC .... G06F 1/1643; G06F 1/1652; G06F 1/1684; G06F 3/041; G06F 3/0412; G06F 3/044; G06F 21/32; G06F 2203/0338; G06F 2203/04102; G06F 2203/04103; G06F 2221/2139; G06K 9/00; G06K 9/00013; G06K 9/00053; H04L 63/0861; H04L 9/3231; H05K 1/111; H05K 1/118; H05K 1/028; H05K 1/0393; H05K 1/097; H05K 3/28; H05K 3/361; H05K 3/4007; H05K 3/041; H05K 2201/026; H05K 2201/05; H05K 2203/0759; G02F 1/1303; G02F 1/13338; G02F 2001/133331; G02F 2202/28
  See application file for complete search history.

(56) References Cited

U.S. PATENT DOCUMENTS

| | | | | |
|---|---|---|---|---|
| 2004/0004605 A1* | 1/2004 | David | ................... | B32B 17/064 345/173 |
| 2004/0191509 A1* | 9/2004 | Kishioka | ................... | B32B 7/10 428/354 |
| 2005/0227387 A1* | 10/2005 | Yokajty | ................. | H01L 51/524 438/22 |
| 2007/0074316 A1* | 3/2007 | Alden | ................... | B82Y 20/00 257/784 |
| 2009/0000735 A1* | 1/2009 | Zwadlo | ................. | G03F 7/2014 156/285 |
| 2010/0218898 A1* | 9/2010 | Zwadlo | ................. | G03F 7/2014 156/362 |
| 2010/0295812 A1* | 11/2010 | Burns | ................... | G06F 3/0412 345/174 |
| 2011/0211135 A1* | 9/2011 | Sharp | ................. | G02B 27/2264 349/15 |
| 2011/0274933 A1* | 11/2011 | Hoshi | ................... | B32B 27/08 428/446 |
| 2012/0092350 A1* | 4/2012 | Ganapathi | .......... | G02B 26/0833 345/501 |
| 2012/0105081 A1* | 5/2012 | Shaikh | ................. | G06K 9/0002 324/686 |
| 2012/0242635 A1* | 9/2012 | Erhart | ................... | G06F 1/1626 345/207 |
| 2012/0327019 A1* | 12/2012 | Takao | ................. | B32B 38/0004 345/174 |
| 2013/0002607 A1* | 1/2013 | Bayramoglu | ........... | G06F 3/044 345/174 |
| 2013/0064967 A1* | 3/2013 | Feinstein | ................. | B05C 9/12 427/8 |
| 2013/0135247 A1* | 5/2013 | Na | ................... | G06F 21/32 345/174 |
| 2013/0248230 A1* | 9/2013 | Park | ................. | G06F 3/044 174/255 |
| 2013/0259329 A1* | 10/2013 | Wickboldt | ............ | H05K 1/189 382/124 |
| 2013/0265137 A1* | 10/2013 | Nelson | ................. | G06K 9/0002 340/5.82 |
| 2014/0009429 A1* | 1/2014 | Verweg | ................. | G06F 3/044 345/174 |
| 2014/0047706 A1* | 2/2014 | Shaikh | ................. | G06K 9/0002 29/622 |
| 2014/0102764 A1* | 4/2014 | Fujino | ..................... | H05K 1/09 174/250 |
| 2014/0150952 A1* | 6/2014 | Sung | ..................... | G02F 1/1303 156/64 |
| 2014/0294259 A1 | 10/2014 | Lee | | |
| 2014/0295150 A1* | 10/2014 | Bower | ....................... | C09J 5/00 428/201 |
| 2014/0321075 A1* | 10/2014 | Sung | ..................... | H05K 1/118 361/750 |
| 2014/0326182 A1* | 11/2014 | Wang | ........................ | B05C 9/06 118/719 |
| 2015/0030217 A1* | 1/2015 | Wickboldt | ......... | G06K 9/00026 382/124 |
| 2015/0324569 A1* | 11/2015 | Hong | ....................... | G06F 21/32 345/174 |
| 2015/0333115 A1* | 11/2015 | Yang | ....................... | H01L 27/12 257/40 |
| 2015/0336357 A1* | 11/2015 | Kang | ....................... | B32B 15/18 428/215 |
| 2015/0367607 A1* | 12/2015 | Garner | ................... | B32B 17/06 428/215 |
| 2016/0009956 A1* | 1/2016 | Hwang | ................... | C09J 133/08 428/41.8 |
| 2016/0042215 A1* | 2/2016 | Wang | ................... | G06K 9/00087 382/124 |
| 2016/0066419 A1* | 3/2016 | Kamei | ................. | H05K 1/0393 174/254 |
| 2016/0083282 A1* | 3/2016 | Jouanno | ................ | B32B 17/061 156/102 |
| 2016/0136937 A1* | 5/2016 | Sung | ................... | B32B 37/1009 156/64 |
| 2016/0202816 A1* | 7/2016 | Park | ....................... | G06F 1/1652 345/173 |
| 2016/0207295 A1* | 7/2016 | Seo | ......................... | B32B 37/10 |
| 2016/0291718 A1* | 10/2016 | Cho | ......................... | G06F 3/03547 |
| 2016/0291765 A1* | 10/2016 | Shen | ......................... | G06F 3/0416 |
| 2016/0291766 A1* | 10/2016 | Shen | ......................... | G06F 3/0416 |
| 2016/0321442 A1* | 11/2016 | Song | ......................... | G06F 3/0488 |
| 2016/0357318 A1* | 12/2016 | Chan | ......................... | G06F 1/1626 |
| 2017/0024553 A1* | 1/2017 | Chang | ..................... | G06F 21/32 |
| 2017/0024597 A1 | 1/2017 | Cho et al. | | |
| 2017/0061193 A1* | 3/2017 | Young | ................... | G06K 9/00013 |
| 2017/0068365 A1* | 3/2017 | Liu | ......................... | G06F 3/0412 |
| 2017/0220182 A1* | 8/2017 | Schwartz | ............. | G06F 3/0416 |
| 2017/0220838 A1* | 8/2017 | He | ........................... | G06K 9/0004 |
| 2017/0260132 A1* | 9/2017 | Kunimoto | ............. | C07C 327/58 |
| 2017/0270342 A1* | 9/2017 | He | ......................... | G06F 3/0412 |
| 2017/0290167 A1* | 10/2017 | Pun | ......................... | H05K 3/0041 |
| 2017/0315396 A1* | 11/2017 | Saiki | ....................... | G06F 3/041 |
| 2017/0316248 A1* | 11/2017 | He | ....................... | G06K 9/00006 |
| 2018/0005005 A1* | 1/2018 | He | ......................... | G06F 3/0412 |
| 2018/0005006 A1* | 1/2018 | Chai | ..................... | G06K 9/0004 |
| 2018/0101253 A1* | 4/2018 | He | ..................... | B32B 17/10018 |
| 2018/0127308 A1* | 5/2018 | Leivo | ..................... | C03C 17/30 |
| 2018/0129798 A1* | 5/2018 | He | ..................... | G06K 9/00013 |
| 2018/0165495 A1* | 6/2018 | Grip | ......................... | G06F 1/16 |
| 2018/0217639 A1* | 8/2018 | Jones | ..................... | G06F 1/1652 |
| 2018/0217854 A1* | 8/2018 | Lee | ......................... | G06F 9/451 |
| 2018/0230279 A1* | 8/2018 | Banzashi | ................ | B32B 5/02 |
| 2018/0260602 A1* | 9/2018 | He | ......................... | G06F 3/0412 |
| 2018/0267666 A1* | 9/2018 | Park | ..................... | G06F 3/0412 |
| 2018/0300526 A1* | 10/2018 | Cho | ..................... | G06K 9/00013 |

(56) References Cited

U.S. PATENT DOCUMENTS

2018/0315804 A1* 11/2018 Li ..................... H01L 27/3244
2018/0364835 A1* 12/2018 Kwon ................... G06F 3/044

FOREIGN PATENT DOCUMENTS

CN          105867696 A    8/2016
JP          2013068563 A   4/2013

* cited by examiner

FLEXIBLE TOUCH PANEL, FLEXIBLE DISPLAY PANEL AND FLEXIBLE DISPLAY APPARATUS, AND FABRICATING METHOD THEREOF

CROSS-REFERENCE TO RELATED APPLICATION

This application is a national stage application under 35 U.S.C. § 371 of International Application No. PCT/CN2016/107058, filed Nov. 24, 2016, the contents of which are incorporated by reference in the entirety.

TECHNICAL FIELD

The present invention relates to display technology, more particularly, to a flexible touch panel, a flexible display panel and a flexible display apparatus having the same, and a fabricating method thereof.

BACKGROUND

Biometrics recognition systems, such as fingerprint recognition systems, have been widely used in consumer electronic apparatuses, including smart phones, tablets, personal data assistants, and laptop computers. Various types of fingerprint recognition systems have been developed, including optical fingerprint scanners, capacitive fingerprint scanners, ultrasonic fingerprint scanners, thermal fingerprint scanners, and the like. A capacitive fingerprint scanner uses an array of capacitor circuits to collect fingerprint data.

SUMMARY

In one aspect, the present invention provides a flexible display panel comprising a flexible touch panel and a flexible display module laminated together with the flexible touch panel. The flexible touch panel comprises a touch sensor comprising a plurality of touch electrodes configured to detect a touch, and a capacitive fingerprint sensor comprising an array of capacitive sensing electrodes configured to enable identification of a fingerprint of a finger.

Optionally, the flexible touch panel further comprises a flexible cover glass, and the plurality of touch electrodes and the array of capacitive sensing electrodes are on the flexible cover glass.

Optionally, the flexible cover glass has a thickness in a range of approximately 25 µm to approximately 150 µm.

Optionally, the plurality of touch electrodes and the array of capacitive sensing electrodes are in a same layer; the touch electrodes are in a touch area; and the array of capacitive sensing electrodes are in a fingerprint sensing area.

Optionally, the touch sensor comprises at least a touch electrode layer on a first side of the flexible cover glass; the array of capacitive sensing electrodes are on the first side of the flexible cover glass; the touch electrode layer is formed in a touch area; and the array of capacitive sensing electrodes are formed in a fingerprint sensing area.

Optionally, the array of capacitive sensing electrodes are operated in a time-division driving mode; the time-division driving mode comprises a touch control mode and a fingerprint sensing mode; the array of capacitive sensing electrodes are touch electrodes for conducting touch signals during the touch control mode; and are capacitive sensing electrodes for recognizing ridge lines and valley lines of the fingerprint during the fingerprint sensing mode.

Optionally, the flexible display panel is a flexible organic light emitting display panel, and the flexible display module is a flexible organic light emitting display module.

Optionally, the flexible organic light emitting display module comprises a flexible base substrate; a display unit on the flexible base substrate; a thin film encapsulating layer on a side of the display unit distal to the flexible base substrate; and a polarizer on a side of the thin film encapsulating layer distal to the display unit.

In another aspect, the present invention provides a flexible touch panel comprising a flexible cover glass; a touch sensor on the flexible cover glass, comprising a plurality of touch electrodes configured to detect a touch, and a capacitive fingerprint sensor on the flexible cover glass, comprising an array of capacitive sensing electrodes configured to enable identification of a fingerprint of a finger.

Optionally, the flexible cover glass has a thickness in a range of approximately 25 µm to approximately 150 µm.

Optionally, the plurality of touch electrodes and the array of capacitive sensing electrodes are in a same layer; the touch electrodes are in a touch area; and the array of capacitive sensing electrodes are in a fingerprint sensing area.

Optionally, the touch sensor comprises at least a touch electrode layer on a first side of the flexible cover glass; the array of capacitive sensing electrodes are on the first side of the flexible cover glass; the touch electrode layer is formed in a touch area; and the array of capacitive sensing electrodes are formed in a fingerprint sensing area.

Optionally, the array of capacitive sensing electrodes are operated in a time-division driving mode; the time-division driving mode comprises a touch control mode and a fingerprint sensing mode; the array of capacitive sensing electrodes are touch electrodes for conducting touch signals during the touch control mode; and are capacitive sensing electrodes for recognizing ridge lines and valley lines of the fingerprint during the fingerprint sensing mode.

In another aspect, the present invention provides a method of fabricating a flexible touch panel, comprising forming a touch sensor and a capacitive fingerprint sensor on a flexible cover glass comprising forming a plurality of touch electrodes configured to detect a touch and an array of capacitive sensing electrodes configured to enable identification of a fingerprint of a finger.

Optionally, forming the plurality of touch electrodes and the array of capacitive sensing electrodes comprises nanoimprinting the array of capacitive sensing electrodes on the flexible cover glass.

Optionally, the plurality of touch electrodes and the array of capacitive sensing electrodes are formed in a same nanoimprinting process; the plurality of touch electrodes is formed in a touch area; and the array of capacitive sensing electrodes are formed in a fingerprint sensing area.

Optionally, the touch sensor comprises at least a touch electrode layer; forming the touch sensor and the capacitive fingerprint sensor comprises nanoimprinting the touch electrode layer in a touch area on a first side of the flexible cover glass; and nanoimprinting the array of capacitive sensing electrodes in a fingerprint sensing area on the first side of the flexible cover glass.

In another aspect, the present invention provides a method of fabricating a flexible display panel, comprising forming a flexible touch panel according to a method described herein; forming a flexible display module; and laminating the flexible touch panel onto the flexible display module.

Optionally, laminating the flexible touch panel onto the flexible display module comprises laminating the flexible touch panel onto the flexible display module in a roll-to-plate manner.

Optionally, the flexible display panel is a flexible organic light emitting display panel, and the flexible display module is a flexible organic light emitting display module; forming the flexible organic light emitting display module comprises forming a display unit on a flexible base substrate; forming a thin film encapsulating layer on a side of the display unit distal to the flexible base substrate; and forming a polarizer on a side of the thin film encapsulating layer distal to the display unit.

Optionally, a plurality of flexible touch panels are formed on a first mother substrate, and a plurality of flexible display modules are formed on a second mother substrate; the method further comprises forming a plurality of flexible touch panels on a first mother substrate comprising a plurality of flexible cover glasses; forming a plurality of flexible display modules are formed on a second mother substrate comprising a plurality of flexible base substrates; laminating the plurality of flexible touch panels onto the plurality of flexible display module, each flexible touch panel laminated onto a corresponding flexible display module; cutting the first mother substrate and the second mother substrate to form a plurality of flexible display panels; cutting a portion of the flexible display panel to expose a driver integrated circuit bonding area on the flexible base substrate; and bonding a driver integrated circuit to the driver integrated circuit bonding area.

In another aspect, the present invention provides a flexible display apparatus comprising a flexible display panel described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional display apparatuses, the fingerprint scanner is typically installed in a designated space, e.g., under a "Home" button on a smart phone. By having a space designated for fingerprint scanner, valuable surface space available for display and touch control is significantly reduced. In the case of fingerprint recognition system using a capacitive-type sensor, another issue with the conventional display apparatuses is sensitivity of the capacitive fingerprint sensor and accuracy of the fingerprint data associated with the sensitivity. The sensitivity of the capacitive fingerprint sensor is significantly correlated with a distance between the finger and the fingerprint sensor electrodes. Fingerprint sensing becomes increasingly difficult as the distance separating the finger and the fingerprint sensor electrodes increases. For example, when the distance is larger than 300 μm, the sensitivity becomes too poor to recognize fingerprint patterns in a meaningful manner, as the electrical field becomes too weak at this distance. The separation distance also leads to blurring of the electric field thus resulting in a loss of resolution in the fingerprint images detected by the fingerprint sensor electrodes.

Accordingly, the present invention provides, inter alia, a flexible touch panel, a flexible display panel and a flexible display apparatus having the same, and a fabricating method thereof that substantially obviate one or more of the problems due to limitations and disadvantages of the related art. In one aspect, the present disclosure provides a flexible display panel having a flexible multiple layer structure. In some embodiments, the flexible display panel includes a flexible touch panel having a touch sensor including a plurality of touch electrodes configured to detect a touch, and a capacitive fingerprint sensor including an array of capacitive sensing electrodes configured to enable identification of a fingerprint of a finger; and a flexible display module laminated together with the flexible touch panel.

Figure 1:
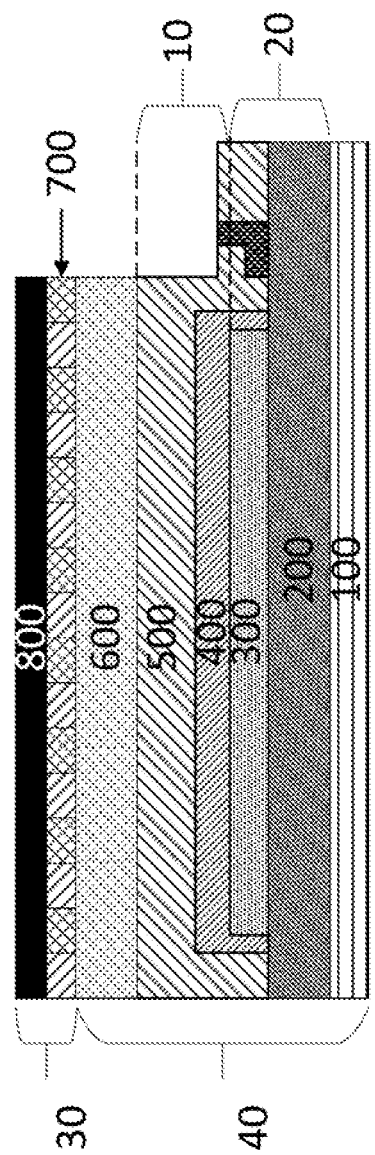
FIG. 1 is a diagram illustrating the structure of a flexible display panel in some embodiments according to the present disclosure.

FIG. 1 is a diagram illustrating the structure of a flexible display panel in some embodiments according to the present disclosure. Referring to FIG. 1, the flexible display panel is a flexible multiple layer structure including a flexible touch panel 30 and a flexible display module 40 laminated together. The flexible display module 40 includes a flexible base substrate 100. The flexible touch panel 30 includes at least a sensor layer 700 on a flexible cover glass 800. The flexible cover glass has a thickness in a range of approximately 25 μm to approximately 150 μm, e.g., approximately 25 μm to approximately 75 μm, or approximately 50 μm.

Figure 2:
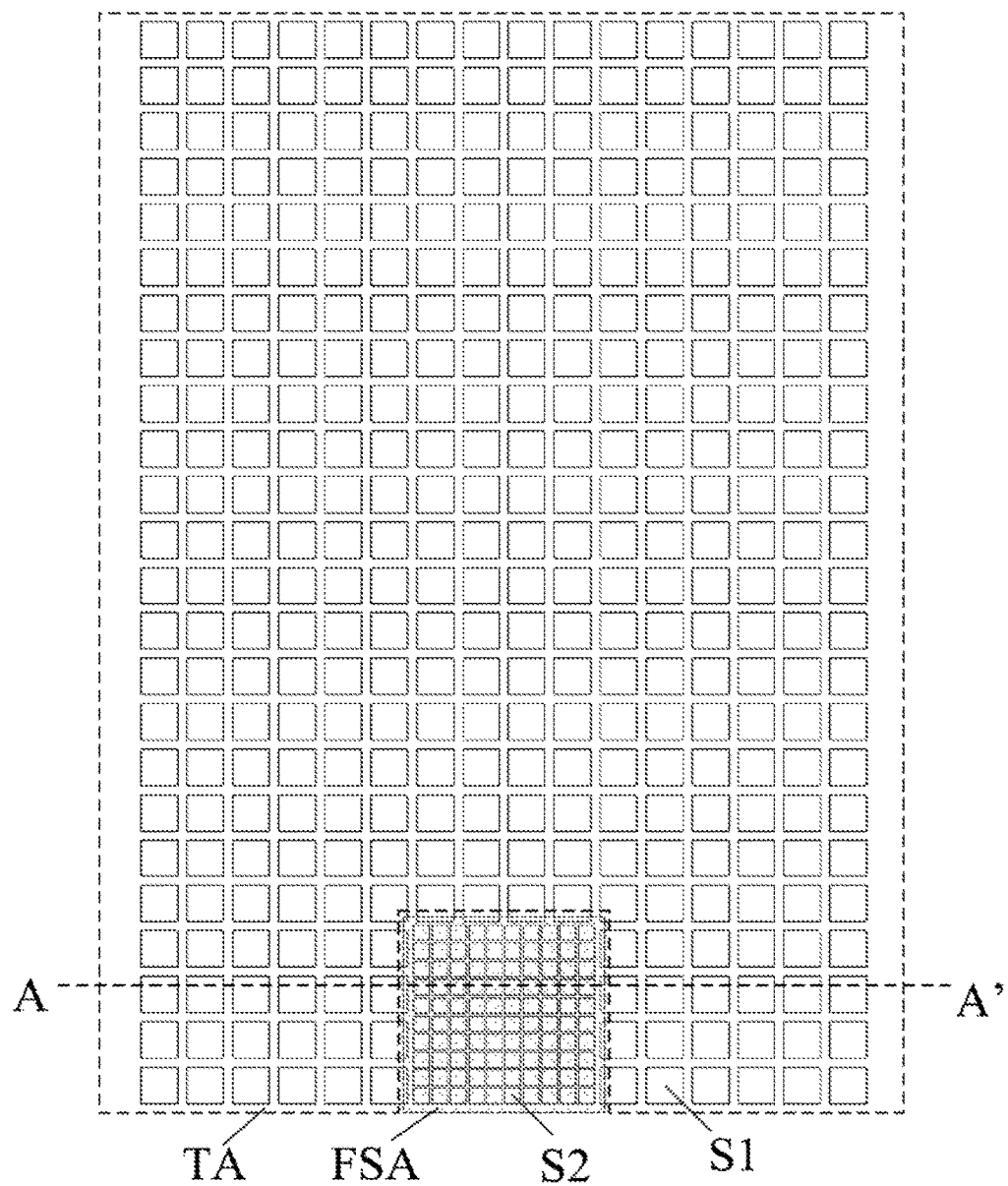
FIG. 2 is a diagram illustrating the structure of a sensor layer in some embodiments according to the present disclosure.

FIG. 2 is a diagram illustrating the structure of a sensor layer in some embodiments according to the present disclosure. Referring to FIG. 2, the sensor layer in some embodiments includes a touch sensor having a plurality of touch electrodes S1 configured to detect a touch, and a capacitive fingerprint sensor including an array of capacitive sensing electrodes S2 configured to enable identification of a fingerprint of a finger. The plurality of touch electrodes S1 and the array of capacitive sensing electrodes S2 are disposed on the flexible cover glass. As shown in FIG. 2, the capacitive sensing electrode S2 has a dimension smaller than that of the touch electrode S1. Optionally, the capacitive sensing electrode S2 has a dimension comparable to that of the touch electrode S1. Optionally, the plurality of touch electrodes S1 is in a touch area TA, and the array of capacitive sensing electrodes S2 are in a fingerprint sensing area FSA. Optionally, the fingerprint sensing area FSA has a higher electrode distribution density (e.g., in terms of numbers of electrodes) than that of the touch area TA. The fingerprint sensing area FSA may be disposed in any region of the flexible display panel, e.g., any region of a display area of the flexible display panel.

In some embodiments, the plurality of touch electrodes S1 and the array of capacitive sensing electrodes S2 are in a same layer, e.g., formed in a same process and using a same material. In some embodiments, the plurality of touch electrodes S1 and the array of capacitive sensing electrodes S2 are substantially on a same horizontal plane on the flexible cover glass, but are formed using different materials (e.g., a metal material and a transparent metal oxide material). As used herein, the term "same layer" refers to the relationship between the layers simultaneously formed in the same step. In one example, the plurality of touch electrodes S1 and the array of capacitive sensing electrodes S2 are in a same layer when they are formed as a result of one or more steps of a same process (e.g., a same nanoimprinting process, or a same patterning process performed in a same layer of material). In another example, the plurality of touch electrodes S1 and the array of capacitive sensing electrodes S2 can be formed in a same layer by simultaneously performing the step of forming the plurality of touch electrodes S1 and the step of forming the array of capacitive sensing electrodes S2. The term "same layer" does not always mean that the thickness of the layer or the height of the layer in a cross-sectional view is the same.

Figure 3:
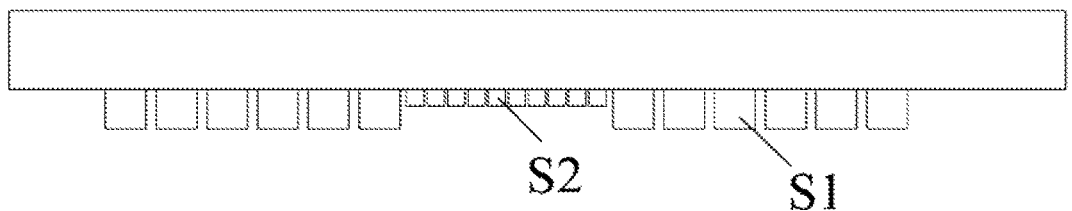
FIG. 3 shows a cross-sectional view along the A-A' direction of the sensor layer in FIG. 2 in some embodiments according to the present disclosure.
Figure 4:
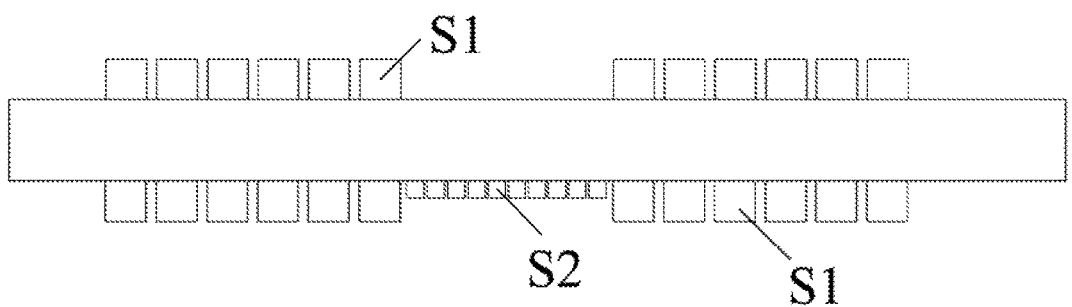
FIG. 4 shows a cross-sectional view along the A-A' direction of the sensor layer in FIG. 2 in some embodiments according to the present disclosure.

In some embodiments, the touch sensor includes a first touch electrode layer having a plurality of touch electrodes S1 on a first side of the flexible cover glass, and a second touch electrode layer having a plurality of touch electrodes S1 on a second side of the flexible cover glass opposite to the first side (see, e.g., FIG. 4). In some embodiments, the touch sensor includes one or more touch electrode layer on the first side of the flexible cover glass, but not on the second side, i.e., all touch electrode layers of the touch sensor are on a same surface of the flexible cover glass (see, e.g., FIG. 3).

In some embodiments, the touch sensor includes at least a touch electrode layer on a first side of the flexible cover glass, and the array of capacitive sensing electrodes are on the first side of the flexible cover glass (see, e.g., FIG. 3 or FIG. 4). Optionally, the touch electrode layer is formed in a touch area, and the array of capacitive sensing electrodes are formed in a fingerprint sensing area. Optionally, the touch area and the fingerprint sensing area are mutually exclusive areas, i.e., the fingerprint sensing area is outside the touch area.

Optionally, the fingerprint sensing area is within the touch area, e.g., the touch area encompasses the fingerprint sensing area. For example, the array of capacitive sensing electrodes may be operated in a time-division driving mode. In some embodiments, the time-division driving mode includes a touch control mode and a fingerprint sensing mode. The array of capacitive sensing electrodes are touch electrodes for conducting touch signals during the touch control mode; and are capacitive sensing electrodes for recognizing ridge lines and valley lines of the fingerprint during the fingerprint sensing mode. Accordingly, during the touch control mode, the fingerprint sensing area is part of the touch area.

In some embodiments, the flexible display panel is a flexible organic light emitting display panel, and the flexible display module is a flexible organic light emitting display module. Referring to FIG. 1, the flexible display module 40 in some embodiments is a flexible organic light emitting display module. As shown in FIG. 1, the flexible organic light emitting display module in some embodiments includes a flexible base substrate 100; a display unit 20 on the flexible base substrate 100; and a thin film encapsulating layer 10 on a side of the display unit 20 distal to the flexible base substrate 100. Optionally, the flexible organic light emitting display module further includes a polarizer 600 on a side of the thin film encapsulating layer 10 distal to the display unit 20.

In some embodiments, the thin film encapsulating layer 10 has a multiple sub-layer structure including two or more sub-layers laminated together. Optionally, the thin film encapsulating layer 10 includes an organic thin film encapsulating sub-layer 400 and an inorganic thin film encapsulating sub-layer 500, as shown in FIG. 1.

The display unit 20 in some embodiments includes an organic light emitting diode 300 and a low temperature polysilicon substrate 200 having a number of display components including a thin film transistor. The flexible display panel includes a plurality of subpixels, each of which has a display unit 20. Optionally, the organic light emitting diode includes an anode, a hole transport layer on the anode, a light emitting layer on a side of the hole transport layer distal to the anode, an electron transport layer on a side of the light emitting layer distal to the hole transport layer, and a cathode on a side of the electron transport layer distal to the light emitting layer. Optionally, the organic light emitting diode further includes a hole injection layer on a side of the hole transport layer proximal to the anode, and an electron injection layer on a side of the electron transport layer proximal to the cathode.

In the present flexible display panel, the fingerprint sensor is integrated into a flexible touch panel of the flexible display panel. By having this design, the fingerprint sensor is separated from a finger during a fingerprint recognition process by only a thin cover glass, a sensitive and accurate fingerprint recognition is made possible. Because the fingerprint sensor is integrated into the flexible touch panel, the fingerprint scanner can be made in a form of a virtual button, obviating the need of a designated area in the display panel for performing fingerprint recognition (e.g., a "Home" button). The fingerprint sensor may be operated in a time-division driving mode, the fingerprint sensing area can be used for display and touch control when the fingerprint sensor is not operated in the fingerprint sensing mode, obviating the need of sacrificing valuable display area for fingerprint recognition function.

In another aspect, the present disclosure provides a flexible touch panel. In some embodiments, the flexible touch panel includes a flexible cover glass, a touch sensor on the flexible cover glass, and a capacitive fingerprint sensor on the flexible cover glass. The touch sensor includes a plurality of touch electrodes configured to detect a touch. The capacitive fingerprint sensor includes an array of capacitive sensing electrodes configured to enable identification of a fingerprint of a finger. Optionally, the flexible cover glass has a thickness in a range of approximately 25 μm to approximately 150 μm, e.g., approximately 25 μm to approximately 75 μm. Optionally, the touch sensor is a metal mesh touch sensor.

In some embodiments, the plurality of touch electrodes and the array of capacitive sensing electrodes are in a same layer, e.g., formed in a same process and using a same material. In some embodiments, the plurality of touch electrodes and the array of capacitive sensing electrodes are substantially on a same horizontal plane on the flexible cover glass, but are formed using different materials (e.g., a metal material and a transparent metal oxide material).

In some embodiments, the touch sensor includes a first touch electrode layer on a first side of the flexible cover glass, and a second touch electrode layer on a second side of the flexible cover glass opposite to the first side. In some embodiments, the touch sensor includes one or more touch electrode layer on the first side of the flexible cover glass, but not on the second side, i.e., all touch electrode layers of the touch sensor are on a same surface of the flexible cover glass.

In some embodiments, the touch sensor includes at least a touch electrode layer on a first side of the flexible cover glass, and the array of capacitive sensing electrodes are on the first side of the flexible cover glass. Optionally, the touch electrode layer is formed in a touch area, and the array of capacitive sensing electrodes are formed in a fingerprint sensing area. Optionally, the touch area and the fingerprint sensing area are mutually exclusive areas, i.e., the fingerprint sensing area is outside the touch area.

Optionally, the fingerprint sensing area is within the touch area, e.g., the touch area encompasses the fingerprint sensing area. For example, the array of capacitive sensing electrodes may be operated in a time-division driving mode. In some embodiments, the time-division driving mode includes a touch control mode and a fingerprint sensing mode. The array of capacitive sensing electrodes are touch electrodes for conducting touch signals during the touch control mode; and are capacitive sensing electrodes for recognizing ridge lines and valley lines of the fingerprint during the fingerprint sensing mode. Accordingly, during the touch control mode, the fingerprint sensing area is part of the touch area.

In another aspect, the present disclosure provides a method of fabricating a flexible touch panel. In some embodiments, the method includes forming a touch sensor and a capacitive fingerprint sensor on a flexible cover glass. Optionally, the step of forming the touch sensor and the capacitive fingerprint sensor includes forming a plurality of touch electrodes configured to detect a touch and an array of capacitive sensing electrodes configured to enable identification of a fingerprint of a finger.

In some embodiments, the capacitive fingerprint sensor is formed using a nanoimprinting lithography process, e.g., the array of capacitive sensing electrodes are formed using a nanoimprinting lithography process. As used herein, the term "nanoimprinting" refers to any method for printing or creating a pattern or structure on the microscale and/or nanoscale size range on the surface of a substrate by contacting a mold with the defined pattern or structure on the surface at certain temperatures and pressures. As used herein, the term "nanoscale" refers to any dimensions that are below approximately 1 µm. As used herein, the term "microscale" refers to any dimensions that are in the range of approximately 1 µm to approximately 100 µm. Optionally, both the touch sensor and the capacitive fingerprint sensor are formed using a nanoimprinting lithography process. Optionally, forming the plurality of touch electrodes and forming the array of capacitive sensing electrodes include nanoimprinting the plurality of touch electrodes and the array of capacitive sensing electrodes on the flexible cover glass. Optionally, the flexible cover glass has a thickness in a range of approximately 25 µm to approximately 150 µm, e.g., approximately 25 µm to approximately 75 µm.

In some embodiments, the plurality of touch electrodes and the array of capacitive sensing electrodes are formed in a same nanoimprinting process. Optionally, the plurality of touch electrodes are formed in a touch area; and the array of capacitive sensing electrodes are formed in a fingerprint sensing area. Optionally, the touch area and the fingerprint sensing area are mutually exclusive areas, i.e., the fingerprint sensing area is outside the touch area. Optionally, the fingerprint sensing area is within the touch area, e.g., the touch area encompasses the fingerprint sensing area.

In some embodiments, the touch sensor includes a first touch electrode layer on a first side of the flexible cover glass, and a second touch electrode layer on a second side of the flexible cover glass opposite to the first side. In some embodiments, the touch sensor includes one or more touch electrode layer on the first side of the flexible cover glass, but not on the second side, i.e., all touch electrode layers of the touch sensor are on a same surface of the flexible cover glass.

In some embodiments, the touch sensor includes at least a touch electrode layer on a first side of the flexible cover glass; and the method includes nanoimprinting the touch electrode layer in a touch area on a first side of the flexible cover glass; and nanoimprinting the array of capacitive sensing electrodes in a fingerprint sensing area on the first side of the flexible cover glass. Optionally, the plurality of touch electrodes and the array of capacitive sensing electrodes are formed in a same layer using a same material in a same nanoimprinting process. Optionally, the plurality of touch electrodes and the array of capacitive sensing electrodes are formed substantially on a same horizontal plane on the flexible cover glass. Optionally, the plurality of touch electrodes and the array of capacitive sensing electrodes are formed in two separate processes. Optionally, the plurality of touch electrodes and the array of capacitive sensing electrodes are formed using different materials (e.g., a metal material and a transparent metal oxide material).

Various appropriate electrode materials may be used to make the touch electrodes and the capacitive sensing electrodes. Examples of appropriate electrode materials include, but are not limited to, transparent metal oxide electrode materials and transparent metal electrode materials. Examples of transparent metal oxide electrode materials include, but are not limited to, indium tin oxide, indium zinc oxide, indium gallium oxide, and indium gallium zinc oxide. Examples of transparent metal electrode materials include, but are not limited to, a metal mesh, a silver nano wire, a carbon nano tube, a nano mesh, graphene, and conductive polymers such as poly(3,4-ethylenedioxythiophene) polystyrene sulfonate (PEDOT:PSS).

In another aspect, the present disclosure provides a method of fabricating a flexible display panel having a flexible multiple layer structure. In some embodiments, the method includes forming a flexible touch panel having a touch sensor including a plurality of touch electrodes configured to detect a touch, and a capacitive fingerprint sensor including an array of capacitive sensing electrodes configured to enable identification of a fingerprint of a finger; forming a flexible display module; and laminating the flexible touch panel onto the flexible display module.

The flexible touch panel may be laminated onto the flexible display module using various appropriate methods. Examples of appropriate methods include, but are not limited to, a roll-to-roll lamination process, a roll-to-plate lamination process, and a plate-to-plate lamination process. In some embodiments, the step of laminating the flexible touch panel onto the flexible display module is performed by laminating the flexible touch panel onto the flexible display module in a roll-to-plate manner. In a roll-to-plate lamination process, the flexible touch panel and the flexible display module can be laminated onto each other with an excellent alignment accuracy, reducing potential alignment errors during the fabrication process. Moreover, a roll-to-plate lamination process also obviates the issue that the base substrate is prone to physical damages occurred in other lamination processes (e.g., a roll-to-roll lamination process).

Figure 5:
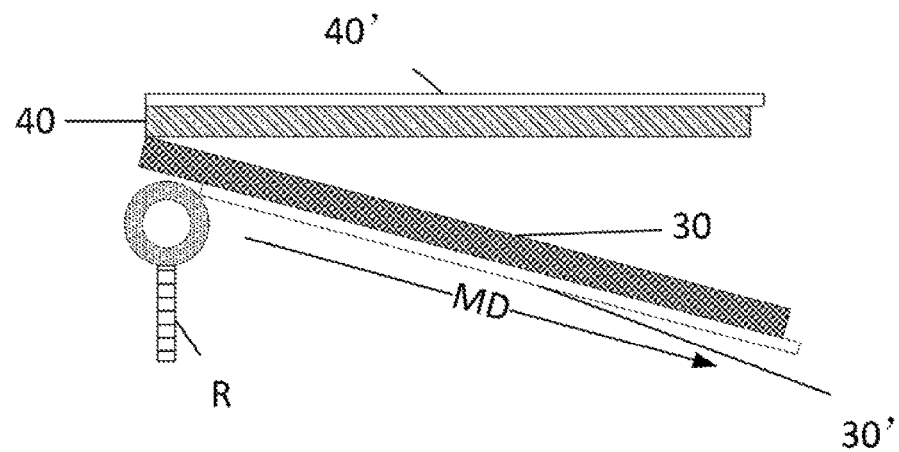
FIG. 5 illustrates a roll-to-plate lamination process in some embodiments according to the present disclosure.
Figure 6:
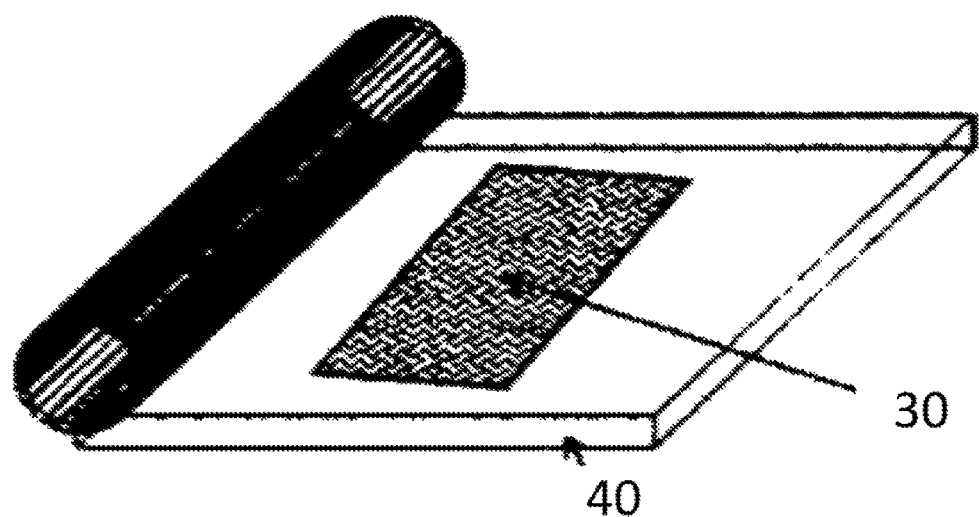
FIG. 6 shows a flexible display module and a flexible touch panel laminated together.

FIG. 5 illustrates a roll-to-plate lamination process in some embodiments according to the present disclosure. Referring to FIG. 5, in the roll-to-plate lamination process, the flexible display module 40 is loaded on a first stage 40', and the flexible touch panel 30 is loaded on a second stage 30'. The flexible display module 40 is secured on the first stage 40', and the flexible touch panel 30 is slidably attached on the second stage 30'. A roller R applies a pressure pressing down the flexible touch panel 30 against the flexible display module 40 secured on the first stage 40'. As the roller R rotates and moves forward, the second stage 30' slidably moves along a moving direction MD, gradually making more areas of the flexible touch panel 30 available for lamination. When the roller R rotates and moves from the left side to the right side of the first stage 40', the entire flexible touch panel 30 is laminated onto the flexible display module 40. FIG. 6 shows a flexible display module and a flexible touch panel laminated together when the lamination process is completed.

In some embodiments, the flexible display panel is a flexible organic light emitting display panel, and the flexible display module is a flexible organic light emitting display module. Accordingly, the method includes a step of forming a flexible organic light emitting display module.

In some embodiments, the step of forming the flexible organic light emitting display module includes forming a display unit on a flexible base substrate; and forming a thin film encapsulating layer on a side of the display unit distal to the flexible base substrate. Optionally, the step of forming the flexible organic light emitting display module further includes forming a polarizer on a side of the thin film encapsulating layer distal to the display unit.

In some embodiments, the thin film encapsulating layer is formed to have a multiple sub-layer structure including two or more sub-layers laminated together. Optionally, the step of forming the thin film encapsulating layer includes forming an organic thin film encapsulating sub-layer and forming an inorganic thin film encapsulating sub-layer.

In some embodiments, the step of forming the display unit includes forming an organic light emitting diode and forming a low temperature polysilicon substrate having a number of display components including a thin film transistor. The flexible display panel includes a plurality of subpixels, each of which has a display unit. Optionally, the step of forming the organic light emitting diode includes forming an anode, forming a hole transport layer on the anode, forming a light emitting layer on a side of the hole transport layer distal to the anode, forming an electron transport layer on a side of the light emitting layer distal to the hole transport layer, and forming a cathode on a side of the electron transport layer distal to the light emitting layer. Optionally, the step of forming the organic light emitting diode further includes forming a hole injection layer on a side of the hole transport layer proximal to the anode, and forming an electron injection layer on a side of the electron transport layer proximal to the cathode.

In some embodiments, the method includes forming a plurality of flexible touch panels on a first mother substrate including a plurality of flexible cover glasses as an integral cover glass, and forming a plurality of flexible display modules are formed on a second mother substrate including a plurality of flexible base substrates as an integral base substrate. In some embodiments, the method further includes laminating the plurality of flexible touch panels onto the plurality of flexible display module, each flexible touch panel laminated onto a corresponding flexible display module; cutting the first mother substrate and the second mother substrate to form a plurality of flexible display panels; cutting a portion of the flexible display panel to expose a driver integrated circuit bonding area on the flexible base substrate; and bonding a driver integrated circuit to the driver integrated circuit bonding area.

Figure 7:
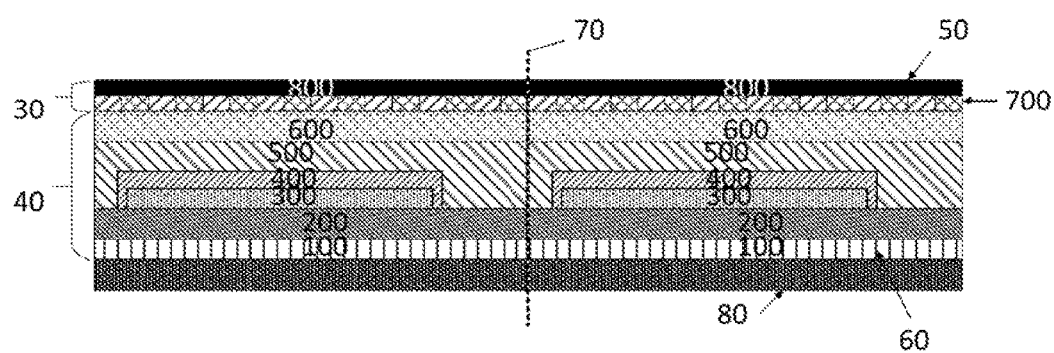
FIG. 7 shows a process of cutting a first mother substrate and a second mother substrate to form a plurality of flexible display panels in some embodiments according to the present disclosure.

FIG. 7 shows a process of cutting a first mother substrate and a second mother substrate to form a plurality of flexible display panels in some embodiments according to the present disclosure. Referring to FIG. 7, the plurality of flexible touch panels 30 are formed on a first mother substrate 50, and the plurality of flexible display modules 40 are formed on a second mother substrate 60. The first mother substrate 50 includes a plurality of flexible cover glass 800 as an integral cover glass. The second mother substrate 60 includes a plurality of flexible base substrates 100 as an integral base substrate. Moreover, the second mother substrate 60 is disposed on a third mother substrate 80 made of glass. As shown in FIG. 7, a plurality of individual flexible display panels can be obtained by cutting the laminated structure formed on the mother substrates along a cutting line 70. The cutting line 70 is located in a peripheral region of the display panel.

Optionally, the laminated structure formed on the mother substrates is first cut (e.g., by laser) along the cutting line to obtain the plurality of individual flexible display panels. A portion of each individual flexible display panel is then cut (e.g., by a blade) to expose a driver integrated circuit bonding area on the flexible base substrate. In the second cutting step, a portion of the flexible touch panel and a portion of the thin film encapsulating layer is cut, but the display unit and the flexible base substrate remain intact.

Optionally, the laminated structure formed on the mother substrates is first cut (e.g., by a blade) to expose a driver integrated circuit bonding area on the flexible base substrate in each flexible display panel. In the first cutting step, the second mother substrate remains intact. Subsequently, the laminated structure is then cut (e.g., by laser) along the cutting line to obtain the plurality of individual flexible display panels.

In a flexible touch panel and a flexible display panel fabricated by the present methods, the fingerprint sensor is integrated into a flexible touch panel of the flexible display panel. By having this design, the fingerprint sensor is separated from a finger during a fingerprint recognition process by only a thin cover glass, a sensitive and accurate fingerprint recognition is made possible. Because the fingerprint sensor is integrated into the flexible touch panel, the fingerprint scanner can be made in a form of a virtual button, obviating the need of a designated area in the display panel for performing fingerprint recognition (e.g., a "Home" button). The fingerprint sensor may be operated in a time-division driving mode, the fingerprint sensing area can be used for display and touch control when the fingerprint sensor is not operated in the fingerprint sensing mode, obviating the need of sacrificing valuable display area for fingerprint recognition function.

In another aspect, the present disclosure provides a flexible touch panel fabricated by a method described herein.

In another aspect, the present disclosure provides a flexible display panel fabricated by a method described herein.

In another aspect, the present disclosure provides a flexible display apparatus having a flexible touch panel described herein or fabricated by a method described herein.

In another aspect, the present disclosure provides a flexible display apparatus having a flexible display panel described herein or fabricated by a method described herein.

Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited by only the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a flexible display panel, comprising:
   forming a flexible touch panel;
   forming a flexible display module;
   loading and securing the flexible display module on a first stage;
   loading and slidably attaching the flexible touch panel on a second stage, wherein a portion the flexible touch panel is not in direct contact with the second stage when the flexible touch panel is initially loaded and slidably attached to the flexible touch panel;
   applying a pressure by a roller pressing down the portion of the flexible touch panel not in direct contact with the second stage against the flexible display module secured on the first stage;
   slidably moving the second stage along a moving direction as the roller rotates and moves forward, thereby gradually making an additional portion of the flexible touch panel available for lamination; and
   applying a pressure by the roller pressing down the additional portion as the stage slidably moving along the moving direction;
   wherein the flexible touch panel is directly laminated onto the flexible display module when the roller rotates and moves from a first side to a second side of the first stage.

2. The method of claim 1, wherein a plurality of flexible touch panels are formed on a first mother substrate, and a plurality of flexible display modules are formed on a second mother substrate;
   the method further comprises:
   forming a plurality of flexible touch panels on a first mother substrate comprising a plurality of flexible cover glasses;
   forming a plurality of flexible display modules are formed on a second mother substrate comprising a plurality of flexible base substrates;
   laminating the plurality of flexible touch panels onto the plurality of flexible display module, each flexible touch panel laminated onto a corresponding flexible display module;
   cutting the first mother substrate and the second mother substrate to form a plurality of flexible display panels;
   cutting a portion of the flexible display panel to expose a driver integrated circuit bonding area on the flexible base substrate; and
   bonding a driver integrated circuit to the driver integrated circuit bonding area.

3. The method of claim 1, wherein forming the flexible touch panel comprises:
   forming a touch sensor and a capacitive fingerprint sensor on a flexible cover glass comprising forming a plurality of touch electrodes configured to detect a touch and an array of capacitive sensing electrodes configured to enable identification of a fingerprint of a finger.

4. The method of claim 3, wherein forming the plurality of touch electrodes and the array of capacitive sensing electrodes comprises nanoimprinting the array of capacitive sensing electrodes on the flexible cover glass.

5. The method of claim 4, wherein the plurality of touch electrodes and the array of capacitive sensing electrodes are formed in a same nanoimprinting process;
   the plurality of touch electrodes is formed in a touch area; and
   the array of capacitive sensing electrodes are formed in a fingerprint sensing area.

* * * * *